United States Patent [19]

Tanaka et al.

[11] Patent Number: 5,016,149

[45] Date of Patent: May 14, 1991

[54] ILLUMINATING METHOD AND ILLUMINATING APPARATUS FOR CARRYING OUT THE SAME, AND PROJECTION EXPOSURE METHOD AND PROJECTION EXPOSURE APPARATUS FOR CARRYING OUT THE SAME

[75] Inventors: Minoru Tanaka, Yokohama; Yoshitada Oshida, Fujisawa; Yasuhiro Yoshitake; Tetsuzo Tanimoto, both of Yokohama, all of Japan

[73] Assignee: Hitachi, Ltd., Tokyo, Japan

[21] Appl. No.: 439,436

[22] Filed: Nov. 20, 1989

[30] Foreign Application Priority Data

Nov. 24, 1988 [JP] Japan .............................. 63-294520

[51] Int. Cl.[5] .............................................. F21K 7/00

[52] U.S. Cl. .................................. 362/259; 362/268; 362/299; 362/328; 362/331; 350/167

[58] Field of Search .............. 362/259, 268, 293, 297, 362/298, 299, 300, 301, 307, 308, 328, 331, 346; 350/167

[56] References Cited

U.S. PATENT DOCUMENTS

| | | | |
|---|---|---|---|
| 4,109,304 | 8/1978 | Khvalovsky et al. | 362/259 X |
| 4,370,026 | 1/1983 | Dubroeudq et al. | 362/259 X |
| 4,851,978 | 7/1989 | Ichihara | 362/259 X |

FOREIGN PATENT DOCUMENTS

| | | |
|---|---|---|
| 54-111832 | 1/1979 | Japan . |
| 56-85724 | 7/1981 | Japan . |
| 59-19332 | 1/1984 | Japan . |
| 62-25483 | 2/1987 | Japan . |

*Primary Examiner*—Stephen F. Husar

*Attorney, Agent, or Firm*—Fay, Sharpe, Beall, Fagan, Minnich & McKee

[57] ABSTRACT

An illuminating method and an illuminating apparatus for use in combination, for example, with an exposure apparatus. The illuminating apparatus comprises amplitude distribution control means for converting the intensity distribution of a light beam emitted by a highly directional light source into a substantially linear intensity distribution, beam splitting means for splitting the light beam into a plurality of component beams, and superposing means for superposing the component beams in a desired area on an object, such as a reticle, in an uniform illuminance distribution.

23 Claims, 8 Drawing Sheets

CONTROL MEANS
UNIFORM BEAM EXPOSURE MEANS
EXCIMA LASER LIGHT SOURCE
6
34
33
32
31
11
1
35
36
A
3
37
2
5
51
4

38
36'
51

FIG. 3
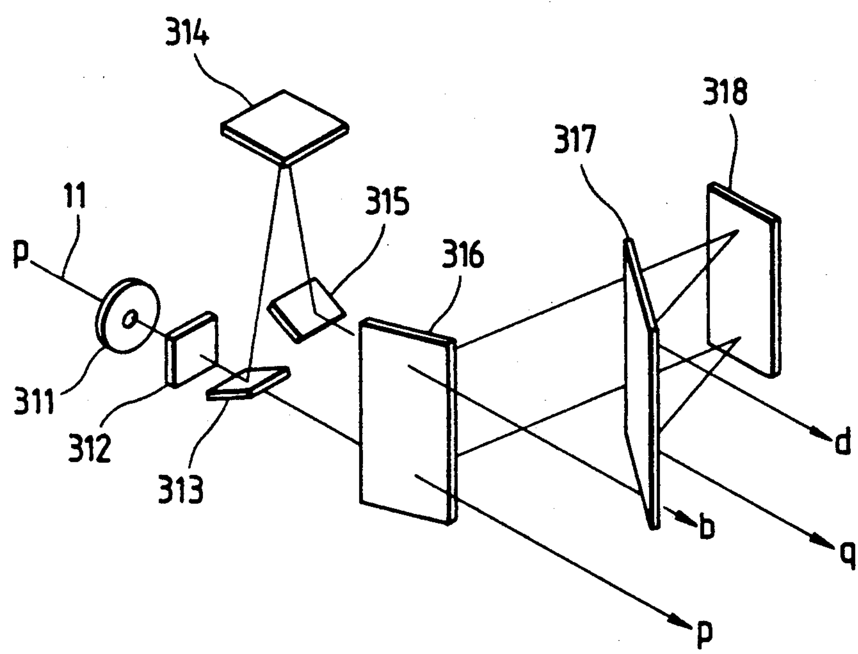
FIG. 4
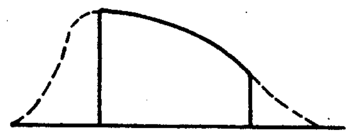
FIG. 5
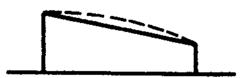
FIG. 6
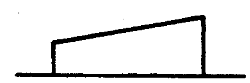
FIG. 7
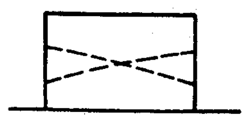
FIG. 8

FIG. 17A
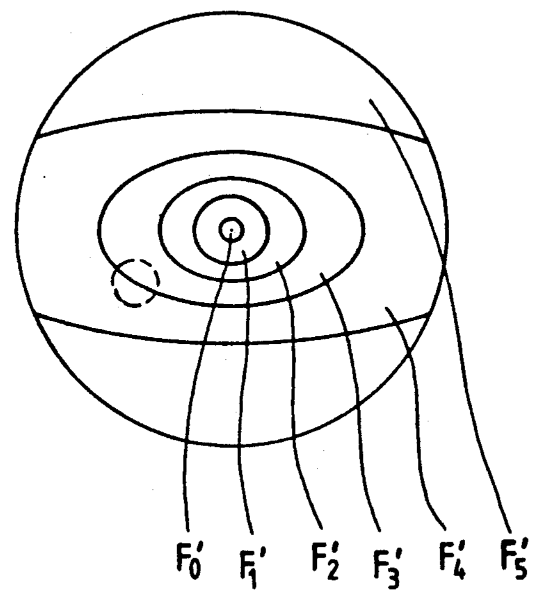
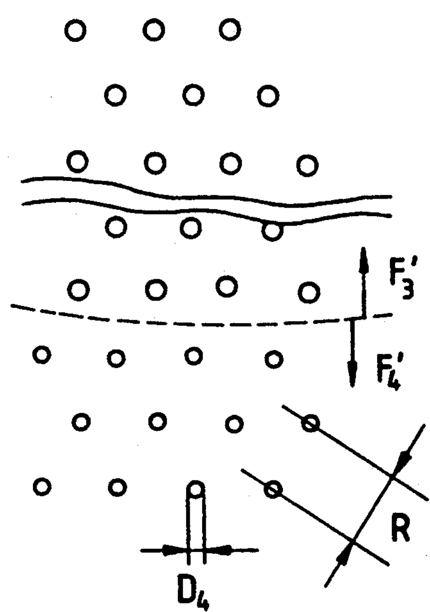
FIG. 17B

FIG. 21
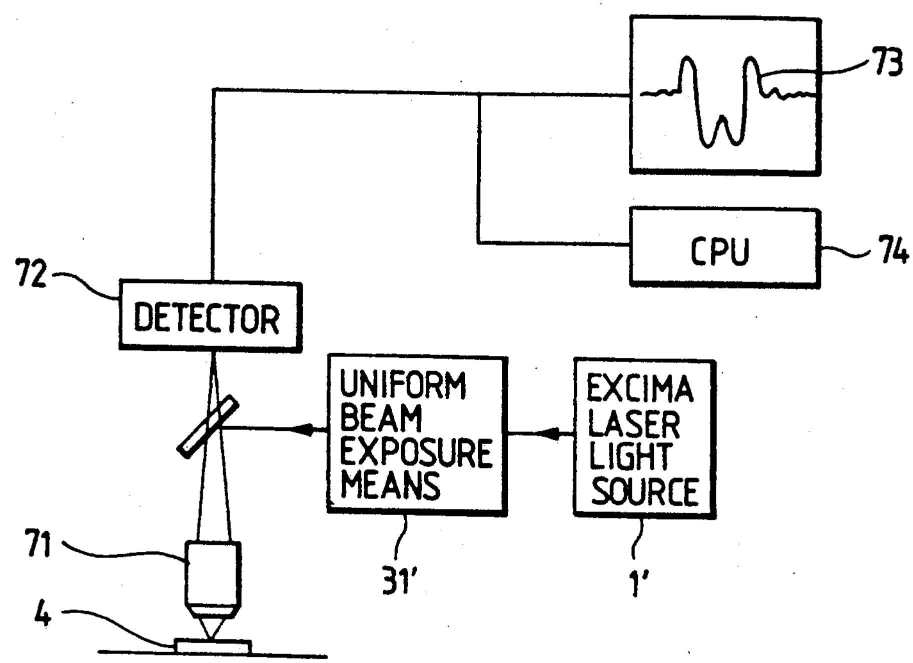
FIG. 22
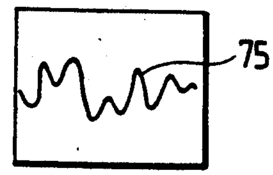
FIG. 23
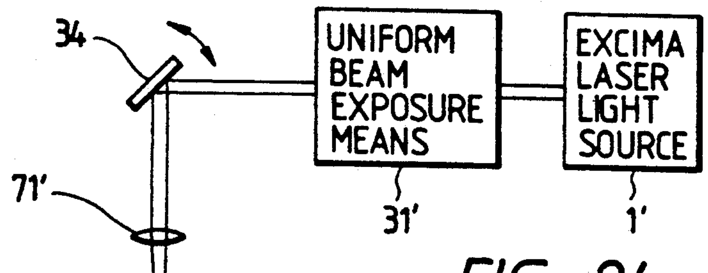
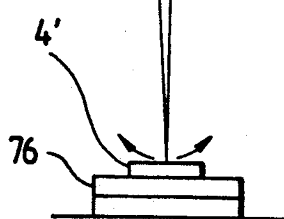
FIG. 24
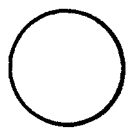
FIG. 25

ILLUMINATING METHOD AND ILLUMINATING APPARATUS FOR CARRYING OUT THE SAME, AND PROJECTION EXPOSURE METHOD AND PROJECTION EXPOSURE APPARATUS FOR CARRYING OUT THE SAME

BACKGROUND OF THE INVENTION

The present invention relates to an illuminating method and an illuminating apparatus employing a highly directional light source, such as a laser light source, and more specifically, an illuminating method and an illuminating apparatus employing a highly directional light source incapable of emitting a light beam of an uniform cross section intensity distribution due to its excessively high directivity, and capable of achieving uniform illumination or illumination with small unevenness in directional intensity distribution, and to a projection exposure method and a projection exposure apparatus employing such an illuminating method and such an illuminating apparatus.

The significance of improvement of resolution in forming a circuit pattern through the use of a light source capable of emitting light of short wavelength for the exposure of circuit patterns of semiconductor circuits has progressively increased in the degree of integration of semiconductor circuits. The ultraviolet laser, typically, an excimer laser, is a prospective exposure light source for its high energy and for its comparatively high capability of narrowing the bandwidth of spectrum. The cross section intensity distribution of a laser beam emitted by the excimer laser assumes a Gaussian distribution with respect to one direction and a trapezoidal distribution in the other direction owing to its structure. In most cases, the trapezoidal distribution curve is distorted or has a peak in the middle portion, and a laser beam having a uniform trapezoidal cross section intensity distribution is rarely obtained. With lasers other than the excimer laser, such as ultraviolet lasers using second and third higher harmonics, uniformity in the outgoing distribution can scarcely be expected.

Variation in the illuminance distribution over the surface of a reticle illuminated on a semiconductor exposure apparatus must be on the order of $\pm 2\%$. When a lot lens for an illuminating system employing a mercury-vapor lamp as a light source is used in simple combination with a laser light source of a narrow bandwidth for uniform illumination, the coherent laser light forms fine interference fringes on the reticle, and hence uniform illumination cannot be achieved.

Methods of uniform illumination by a laser beam having a Gaussian intensity distribution are disclosed in Japanese Patent Provisional Publication (Kokai) Nos. 56-85724 (first reference) and 59-19332 (second reference). The method of the first reference splits the laser beam into four component beams in a cross section perpendicular to the direction of travel of the laser beam, and superposes the four component beams of the laser beam on an object plane for uniform illumination. To obviate irregular illumination attributable to interference fringes resulting from the superposition of the four component beams of the laser beam, the four component beams are divided into two sets each of two component beams, the interference between the two component beams of one of the sets is suppressed by polarizing the two component beams of the set so that the respective directions of polarization are perpendicular to each other, and the phase of one of the two component beams of the other set is varied within a period of illumination so that interference fringes are caused to disappear by averaging the periods of illumination.

Conventional methods of uniform illumination including that of the first reference are unable to reduce the variation of illumination below a level corresponding to a variation on the order of 3% in illuminance even if the unevenness in illumination attributable to the interference between the two component beams, because the Gaussian distributions are superposed without alteration. These conventional methods are scarcely able to obviate interference fringes and to achieve uniform illumination by varying the phase accurately by a phase angle of $\pi$ in synchronism with pulse emission within a short time between the former and latter halves of the short pulse when applied to illumination using a laser of short pulse duration, such as an excimer laser employed in the present invention, because the pulse duration is a very short time in the range of several nanoseconds to several tens nanoseconds. Accordingly, when such conventional illuminating methods are employed for illumination, a variation in the illuminance distribution attributable to the interference fringes is added to the foregoing variation on the order of 3% in the illuminance distribution to increase the variation in illuminance distribution to a level on the order of 10% in total. Accordingly, such conventional illuminating methods are not applicable to a field to which the present invention pertains.

The illuminating method of the second reference splits likewise a laser beam having a Gaussian intensity distribution into four component beams and superposes these four component beams for uniform illumination. However, since no means for obviating the interference between the four component beams of the laser beam is provided in the optical path between a point of division and a point of superposition, fine interference fringes are formed when the four component beams are superposed. When this illuminating method is applied to illuminating a reticle on an exposure apparatus, the interference fringes formed on the reticle are printed on a wafer, so that it is impossible to print a circuit pattern formed on the reticle accurately on the wafer.

Japanese Patent Provisional Publication (Kokai) No. 54-111832 (third reference) discloses an exposure method intended to obviate interference fringes resulting from the superposition of the component beams of a laser beam on a reticle and to eliminate speckle noise. This exposure method makes the component beams travel respectively along optical paths having different optical path lengths. Japanese Patent Provisional Publication (Kokai) No. 62-25483 (fourth reference) discloses a method of forming optical paths having different optical path lengths by optical path altering means employing reflection mirrors. This method of the fourth reference is effective with a laser beam having a Gaussian intensity distribution in macroscopically uniformizing the illuminance distribution in part or in microscopically uniformizing the illuminance distribution (reduction of speckle noise), but unable to uniformize the illuminance distribution both macroscopically and microscopically.

SUMMARY OF THE INVENTION

Accordingly, it is an object of the present invention to provide an illuminating method, an illuminating apparatus, a projection exposure method and a projection exposure apparatus capable of illuminating an object in both macroscopically and microscopically uniform illuminance distribution by a laser beam emitted by a laser light source having a desired directivity necessary for accurately projecting an original pattern formed on a reticle, and capable of using the laser beam emitted by the laser light source at a high energy efficiency.

According to the present invention, the intensity distribution of a laser beam emitted by a highly directional light source, such as an excimer laser, is converted into a substantially linear distribution by amplitude distribution control means, the laser beam is split into a plurality of component beams, the component beams are superposed on an object, such as a reticle, by superposing means so that a desired area on the object is illuminated in an uniform illuminance distribution.

BRIEF DESCRIPTION OF THE DRAWINGS

FIG. 3 is a perspective view showing the configuration of a uniform exposure unit embodying the present invention;

FIGS. 4 to 8 are diagrams of intensity distributions of a laser beam at different positions on an optical path in the uniform exposure unit of FIG. 3;

FIG. 17 is an enlarged view of a two-dimensional diffraction grating filter included in the effective amplitude distribution control unit of FIG. 13;

FIG. 21 is a block diagram of a pattern detecting apparatus combined with a uniform exposure apparatus embodying the present invention;

FIG. 22 is a diagram showing the waveform of a detection signal including noise provided by the pattern detecting apparatus of FIG. 21 when the pattern detecting apparatus is not provided with the uniform exposure apparatus;

FIG. 23 is a schematic view of a laser beam machine combined with a uniform exposure apparatus embodying the present invention;

FIG. 24 is a plan view of a hole formed by the laser beam machine of FIG. 23; and FIG. 25 is a plan view of a hole formed by the laser beam machine when the laser beam machine is not provided with the uniform exposure apparatus.

DESCRIPTION OF THE PREFERRED EMBODIMENTS

Figures 1, 2:
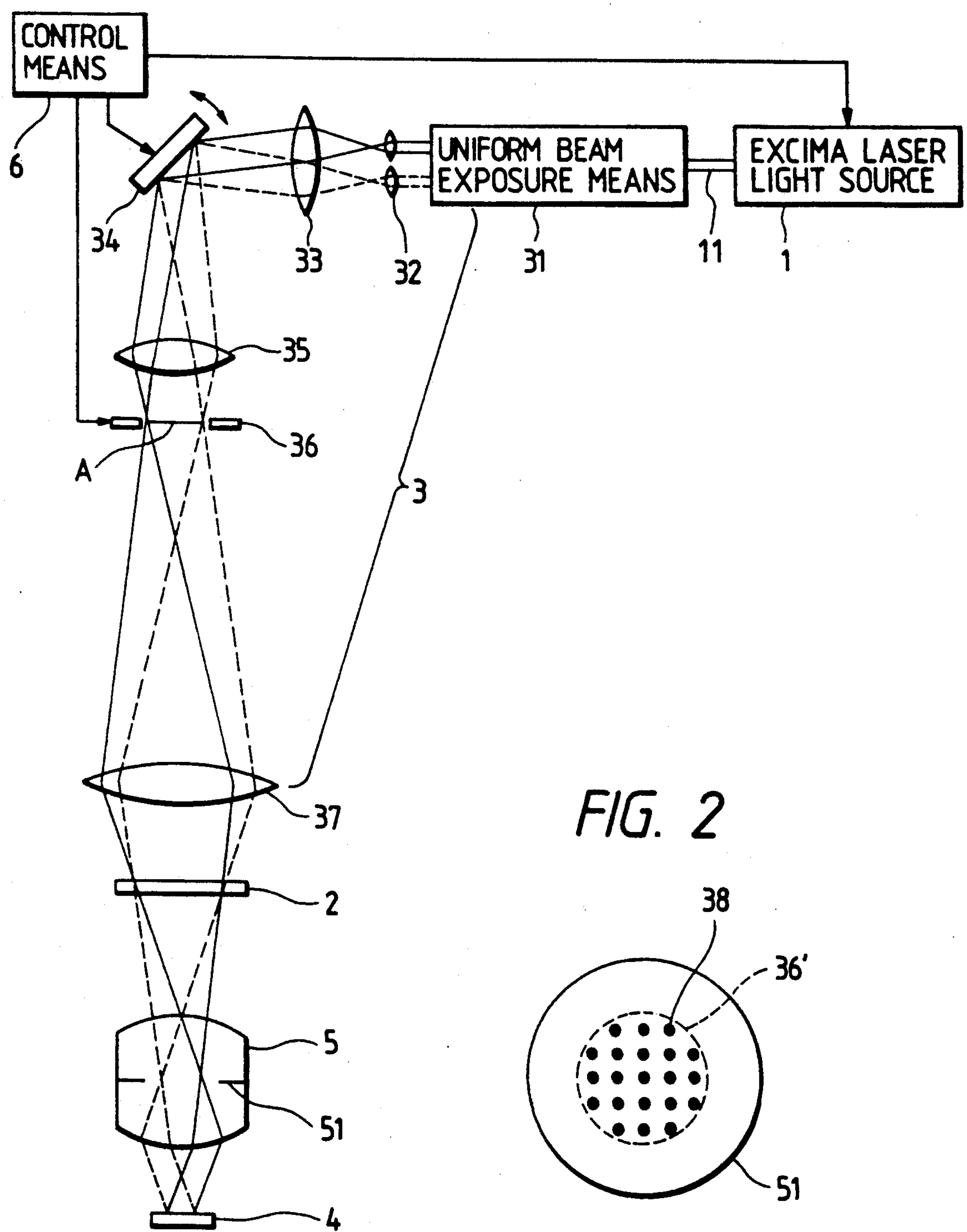
FIG. 1 is a diagrammatic view of an exposure apparatus employing an excimer laser, in a first embodiment according to the present invention.
FIG. 2 is a plan view of a lens pupil, showing an arrangement of the spots of scanning laser beams.

Prior to the description of the preferred embodiments of the present invention, the general conception of the present invention will be described.

In a first aspect of the present invention, the intensity distribution of a light beam emitted by a highly directional light source is converted into a substantially linear distribution, the light beam is split into a plurality of component light beams, and the component light beams are superposed in a desired area on an object so that the component light beams will not interfere with each other to illuminate the desired area in a uniform illuminance distribution.

In a second aspect of the present invention, an apparatus capable of illuminating a desired area on an object in a uniform illuminance distribution comprises a highly directional light source, effective amplitude distribution control means for converting the intensity distribution in a desired distribution range of a light beam emitted by the light source into a substantially linear intensity distribution, light beam splitting means for splitting the light beam into a plurality of component light beams, and superposing means for superposing the component light beams obtained by converting the intensity distribution of the light beam into a substantially linear intensity distribution by the effective amplitude distribution control means and splitting the light beam by the light beam splitting means on an object.

In a third aspect of the present invention, an apparatus comprises a highly directional light source, light beam splitting means for splitting a light beam emitted by the highly directional light source into a plurality of component light beams, and superposing means for making the component light beams travel respectively along optical paths having different optical path lengths differing from each other by lengths not less than the coherent length of the light beam and for superposing the component light beams respectively having intensity distributions inverse to each other on an object.

In a fourth aspect of the present invention, an apparatus comprises a highly directional light source, effective amplitude distribution control means for converting the intensity distribution in a desired distribution range of a light beam emitted by the light source into a substantially linear intensity distribution, light beam splitting means for splitting the light beam into a plurality of component light beams, superposing means for superposing the component light beams formed by converting the intensity distribution of the light beam into a substantially linear intensity distribution by the effective amplitude distribution control means and by splitting the light beam by the light beam splitting means on a predetermined plane, a lot lens or a fly-eye lens disposed with its entrance surface coinciding with the predetermined plane, and a condenser lens for directing transmitted light transmitted through the lot lens or the fly-eye lens onto an object.

In a fifth aspect of the present invention, an apparatus comprises a highly directional light source, light beam splitting means for splitting a light beam emitted by the light source into a plurality of component light beams, superposing means for making the component light beams travel respectively along optical paths having different optical path lengths differing from each other by lengths not less than the coherent length and superposing the component light beams respectively having intensity distributions inverse to each other on a predetermined plane, a lot lens of a fly-eye lens disposed with its entrance surface coinciding with the predetermined plane, and a condenser lens for directing transmitted light transmitted through the lot lens or the fly-eye lens onto an object.

In a sixth aspect of the present invention, a projection exposure method comprises steps of converting the intensity distribution of a light beam emitted by a highly directional light source into a substantially linear intensity distribution, splitting the light beam into a plurality of component light beams, superposing the component light beams in a desired area on a reticle so that the component light beams will not interfere with each other to illuminate the desired area of the reticle in a uniform illuminance distribution, and projecting a circuit pattern formed on the reticle on a substrate on a reduced scale by a projection lens.

In a seventh aspect of the present invention, a projection exposure apparatus comprises: an illuminating unit comprising a highly directional light source, effective amplitude distribution control means for converting the intensity distribution in a desired distribution range of a light beam emitted by the light source into a substantially linear intensity distribution, light beam splitting means for splitting the light beam into a plurality of component light beams, and superposing means for superposing the component light beams obtained by converting the intensity distribution of the light beam into a substantially linear intensity distribution by the effective amplitude control means and splitting the light beam by the light beam splitting means on a reticle to illuminate the reticle in a uniform illuminance distribution.; and a projection lens for projecting the image of a circuit pattern formed on the reticle illuminated by the illuminating unit on a substrate on a reduced scale.

In an eighth aspect of the present invention, a projection exposure apparatus comprises: an illuminating unit comprising a highly directional light source, light beam splitting means for splitting a light beam emitted by the light source into a plurality of component light beams, and superposing means for making the component light beams travel respectively along optical paths having different optical path lengths differing from each other by a length not less than the coherent length of the light beam and superposing the component light beams respectively having intensity distributions inverse to each other on a reticle; and a projection lens for projecting the image of a circuit pattern formed on the reticle illuminated by the illuminating unit on a substrate on a reduced scale.

In a ninth aspect of the present invention, a projection exposure apparatus comprises: an illuminating unit comprising a highly directional light source, effective amplitude distribution control means for converting the intensity distribution in a desired distribution range of a light beam emitted by the light source into a substantially linear intensity distribution, light beam splitting means for splitting the light beam into a plurality of component light beams, a superposing means for superposing the component light beams obtained by converting the intensity distribution of the light beam into the substantially linear intensity distribution by the effective amplitude distribution control means and splitting the light beam by the light beam splitting means on a predetermined plane, a lot lens or a fly-eye lens disposed with its entrance surface coinciding with the predetermined plane, and a condenser lens for directing transmitted light transmitted through the lot lens or the fly-eye lens onto a reticle; and a projection lens for projecting the image of a circuit pattern formed on the reticle illuminated by the illuminating unit on a substrate on a reduced scale.

In a tenth aspect of the present invention, a projection exposure apparatus comprises: an illuminating unit comprising a highly directional light source, light beam splitting means for splitting a light beam emitted by the light source into a plurality of component light beams, superposing means for making the component light beams split by the light beam splitting means travel respectively along optical paths having different optical path lengths different from each other by lengths not less than the coherent length of the light beam and superposing the component light beams respectively having intensity distributions inverse to each other on a predetermined plane, a lot lens or a fly-eye lens disposed with its entrance surface coinciding with the predetermined plane, and a condenser lens for directing transmitted light transmitted through the lot lens or the fly-eye lens onto a reticle; and a projection lens for projecting the image of a circuit pattern formed on the reticle illuminated by the illuminating unit on a reduced scale.

Thus, the present invention is capable of converting the intensity distribution of a laser beam emitted by a laser into a linear intensity distribution. For example, with most laser beams emitted by excimer lasers, the intensity distribution in one direction assumes a Gaussian distribution and the intensity distribution in the other direction assumes a trapezoidal distribution. The intensity distribution in a desired distribution range of such an intensity distribution, which is most energy efficient and is used most effectively, is converted into a linear intensity distribution by the effective amplitude distribution control means. The light beam having a linear intensity distribution is split by a beam splitter or the like into component light beams, and then the component beams are superposed after traveling respectively along optical paths having different optical path lengths differing from each other by lengths not less than the coherent length of the light beam when the coherent length is large. In superposing a component light beam A having a linear intensity distribution declining to the right and a component light beam B having a linear intensity distribution, for instance, the linear intensity distribution of the component light beam B is inverted by mirrors or the like so as to decline to the left, consequently, the object, such as the reticle, is illuminated by the component light beams A and B in a macroscopically uniform illuminance distribution and microscopic irregularities in illumination, such as interference fringes, are eliminated. Since the component light beams fall on the reticle at different angles of incidence, the reticle is not illuminated by an excessively directional light beam. Furthermore, when the number of the component light beams is small, the directivity of illumination is insufficient. In such a case, all the component light beams are deflected simultaneously by optical deflecting means disposed at a position conjugate with the reticle and exposure is completed within the time of deflection to illuminate the reticle by a light beam having a desired directivity.

The invention will be described hereinafter with reference to the preferred embodiments thereof illustrated in the accompanying drawings.

The general construction and operation of an illuminating apparatus in a first embodiment according to the present invention will be described with reference to FIG. 1 as applied to an exposure apparatus. An illuminating apparatus 3 illuminates a reticle 2 uniformly with a pulse laser beam 11 emitted by an excimer laser light source 1, i.e., an ultraviolet laser light source. The laser beam transmitted through the reticle 2 is focused by a reduction lens 5, such as a quartz lens, on the surface of a wafer 4 coated with a photoresist to form the image of a pattern formed on the reticle 2. The illuminating apparatus 3 comprises the excimer laser light source 1, an uniform beam exposure means 31, a control means 6, focusing lenses 32, 33 and 35, a deflecting mirror 34, an aperture diaphragm 36, and a focusing lens 37. The uniform beam exposure means 31 uniformizes the itensity distribution of the laser beam 11 emitted by the excimer laser light source 1. The laser beam 11 is focused by the focusing lenses 32, 33 and 35 and the deflecting mirror 34 on a plane A including the aperture diaphragm 36. The focusing lens 37 focuses the laser beam 11 on the pupil 51 of the reduction lens 51. The deflecting mirror 34 and the pattern surface (lower surface) of the reticle 2 are set in a conjugate relation by the lenses 35 and 37. The control means 6 controls the pulse laser beam emitting timing of the excimer laser light source 1 and the deflecting timing of the deflecting mirror 34 for synchronous operation and adjusts the aperture of the aperture diaphragm 36 to an appropriate value to form laser beam spots 38 on the pupil 51 of the reduction lens 5 in a pattern as shown in FIG. 2. In focusing the laser beam 11 in such a pattern on the pupil 51, the angle of incidence of the laser beam 11 on the reticle 2 is varied. In either case, it is desirable that the laser beam has a uniform intensity distribution on the reticle 2. The uniform beam exposure means 31 uniformizes the intensity distribution of the laser beam.

FIG. 3 shows the configuration of the uniform beam exposure means 31. Generally, the intensity of the laser beam 11 emitted by the laser light source 1 is high in the central portion of the laser beam 11 and low in the peripheral portion of the same. In some cases, a laser beam emitted by an excimer laser has an asymmetric intensity distribution as shown in FIG. 4. A beam selector 311 selects effectively the central portion of the laser beam 11 as indicated by solid lines in FIG. 4. The range of selection is determined so that the selected portion of the intensity distribution can be converted into a linear intensity distribution by an effective amplitude distribution controller 312 and includes a portion having the maximum intensity. The laser beam transmitted through the effective amplitude intensity controller 312 is split into two component beams by a semitransparent mirror 313. FIG. 5 shows the intensity distribution of the component laser beam having a linear intensity distribution formed by the effective amplitude distribution controller 312 and transmitted through the semitransparent mirror 313. The other component laser beam is reflected three times (an odd number of times) by the semitransparent mirror 313 and total reflection mirrors 314 and 315 so that the component laser beam falls on a semitransparent mirror 316 in parallel to the former component laser beam. It is to be noted that the former component laser beam is reflected an even number of times (0, 2, 4, . . .) and the latter component laser beam is reflected an odd number of times (1, 3, 5, . .) so that the respective intensity distributions of the two component laser beams are inverse to each other. Then, each of the two component laser beams fallen on the semitransparent mirror 316 is split further into two component laser beams to form four component laser beams p, q, b and d. The respective intensity distributions of the component laser beams p and q, and those of the component laser beams b and d are inverse to each other (FIGS. 5 and 6). The component laser beams p, q, b and d are superposed on the reticle 2 as shown in FIG. 1 to illuminate the reticle 2 in a uniform illuminance distribution as shown in FIG. 7. In splitting the laser beam 11 and the two component laser beams, the components of the intensity uniformizing unit 31 so as to make the component laser beams travel respectively along optical paths differing from each other by lengths not less than the coherent length of the laser beam to eliminate interference between the component laser beams so that the reticle 2 is illuminated by incoherent laser beams. For example, when the coherent length is l, the optical path length from the semitransparent mirror 313 via the total reflection mirror 314 to the total reflection mirror 315 is l, and the optical path length from the semitransparent mirror 316 via the total reflection mirror 318 to the total reflection mirror 317 is 2l, the difference between the respective optical path lengths of the component laser beams p and q, and that between the respective optical path lengths of the component laser beams b and d are not more less than the coherent length l. The coherent length l is defined by: $l=\lambda^2/\Delta\lambda$, where $\lambda$ is the center wavelength of the laser beam, and $\Delta\lambda$ is the spectral full width at half maximum.

The foregoing illuminating apparatus is intended to illuminate the reticle in a perfectly uniform illuminance distribution. If a slight difference in illuminance intensity between the central portion and peripheral portion of the reticle is permitted, illuminating apparatus in second and third embodiment according to the present invention are satisfactory.

The illuminating apparatus in the second embodiment is substantially the same in construction as that in the first embodiment except that the effective amplitude distribution controller 312 is omitted. FIG. 8 shows an illuminance distribution on the reticle illuminated by this illuminating apparatus., in which the illuminance in the central portion of the reticle is slightly higher than that in the peripheral portion of the same.

Figure 9:
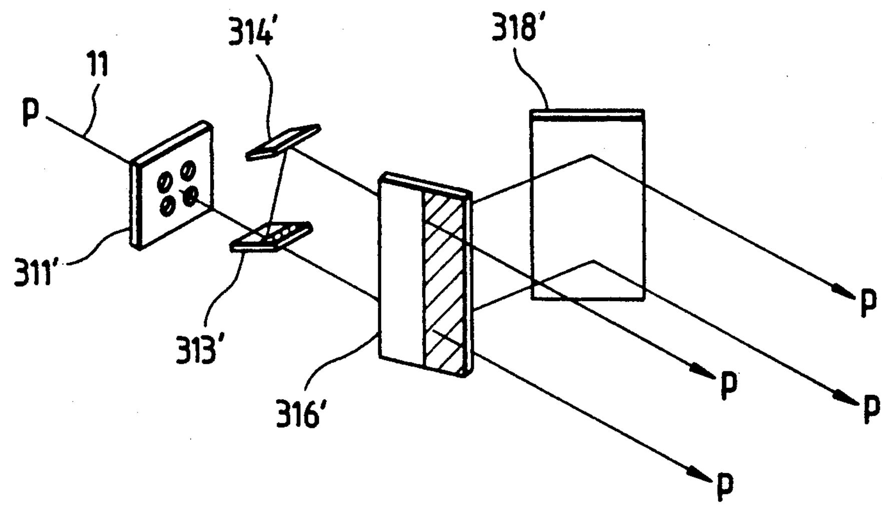
FIG. 9 is perspective view showing the configuration of another uniform exposure unit embodying the present invention.

FIG. 9 shows an intensity uniformizing unit incorporated in the illuminating apparatus in the third embodiment according to the present invention. This illuminating apparatus is effective when a laser beam having a symmetric intensity distribution as shown in FIG. 10 is used.

Figure 10:
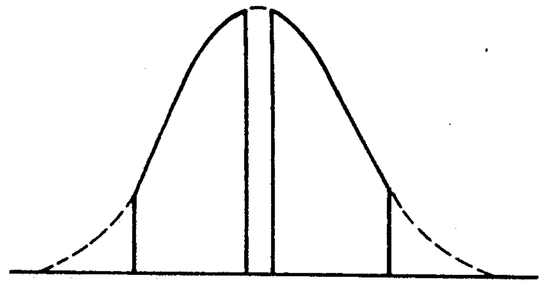
FIGS. 10 and 11 are diagrams of intensity distributions of a laser beam at different positions on an optical path in the uniform exposure unit of FIG. 9.
Figure 11:
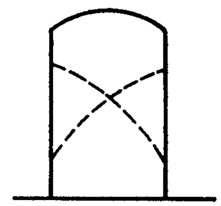

Referring to FIG. 9, a beam selector 311' having four apertures selects symmetric portions indicated by solid lines in FIG. 10 in four laser beams. Each of the four laser beams is split into four component laser beams by mirrors 313' and 316' each having a reflecting surface in half the entire area thereof (hatched area) and total reflection mirrors 314' and 318'. The respective intensity distributions of the four component laser beams are not inverse to each other because the component laser beams are reflected an even number of times (0, 2, 4, . . .). The component laser beams travel respectively along optical paths having different optical path lengths differing from each other by lengths not less than the coherent length. The four component laser beams are superposed on the reticle to illuminate the reticle in a uniform illuminance distribution as shown in FIG. 11.

Figure 12:
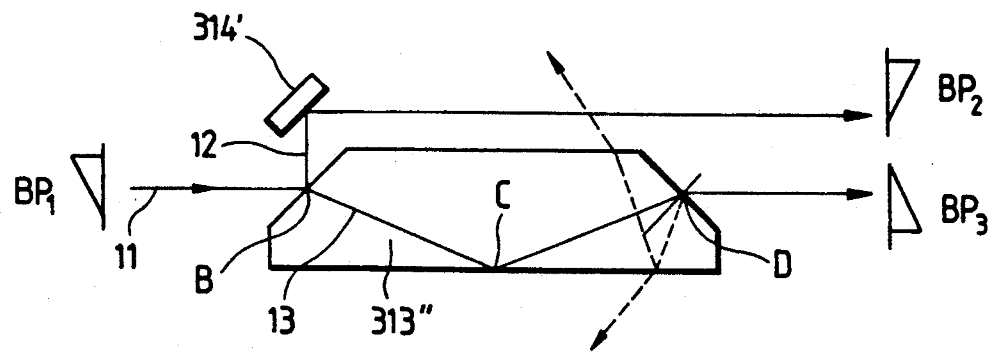
FIG. 12 is a diagrammatic view of a prism included in a beam splitter.

FIG. 12 shows a prism beam splitter applicable to an illuminating apparatus embodying the present invention. The beam splitters employed in the illuminating apparatus of FIGS. 3 and 9 are parallel flat plate beam splitters. When a highly coherent laser beam is transmitted through a parallel flat plate beam splitter, interference fringes are formed due to reflection from the opposite surface (reflection from the surface C) to deteriorate the illuminance distribution when the thickness of the plate is not less than the coherent length. The prism beam splitter as shown in FIG. 12 is free from such a trouble.

Referring to FIG. 12, a laser beam 11 having an example pattern $BP_1$ falls on the prism beam splitter 313" at a point B. The laser beam 11 is split into a reflected beam 12 and a transmitted beam 13. The reflected beam 12 is reflected again by a total reflection mirror 314' and travels to the right as viewed in FIG. 12 along a straight optical path. Since the reflected beam 12 is reflected twice, the example pattern $BP_2$ of the reflected beam 12 is the same as that of the laser beam 11. The transmitted beam 13 is reflected within the prism by the surface C, comes out of the prism at a point D and travels to the right in parallel to the reflected beam 12. Since the transmitted beam 13 is reflected once within the prism, the example pattern $BP_3$ of the transmitted beam 13 is inverse to that of the incident laser beam 11. Although part of the transmitted beam 13 is reflected at the point D, no interference fringe is formed, because the part of the transmitted beam 13 reflected at the point D travels in the reverse direction.

Figure 13:
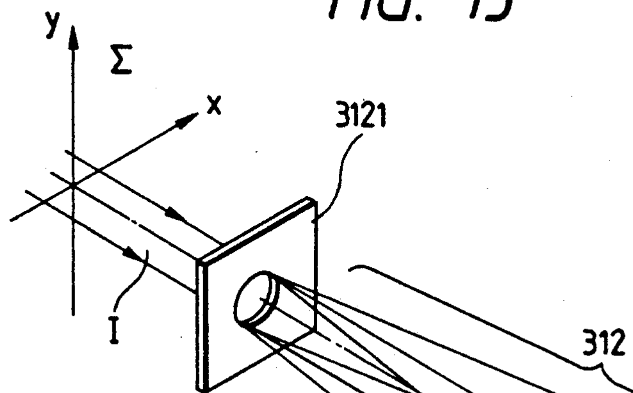
FIG. 13 is a perspective view of assistance in explaining an effective amplitude distribution control unit embodying the present invention.
Figure 14:
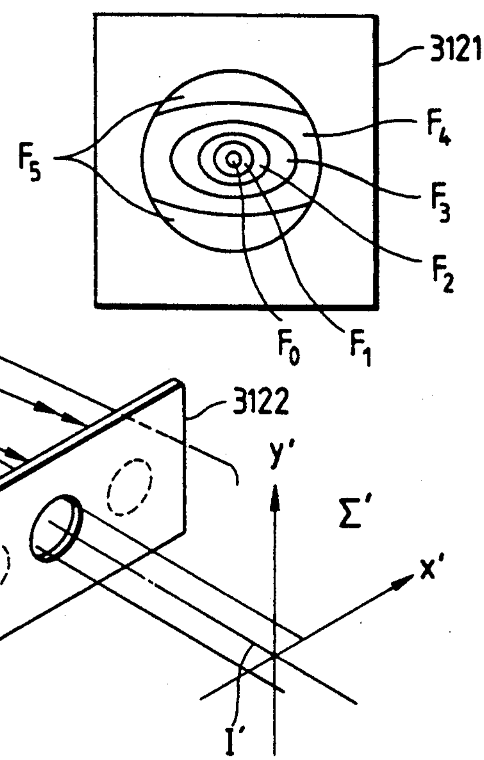
FIG. 14 is an enlarged view of a diffraction grating filter included in the effective amplitude distribution control unit of FIG. 13.
Figure 15A:
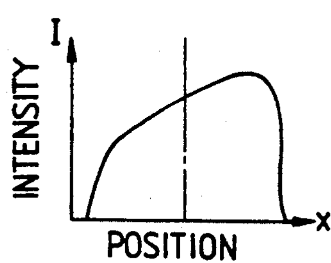
FIGS. 15A–15D show diagrams of intensity distributions of a laser beam before and after the effective amplitude distribution control unit of FIG. 13.
Figure 15B:
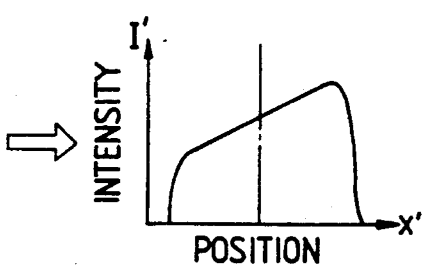
Figure 15C:
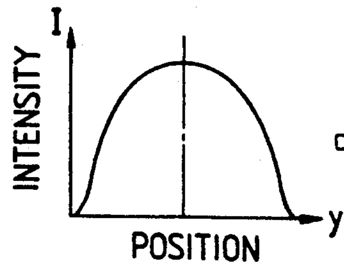
Figure 15D:
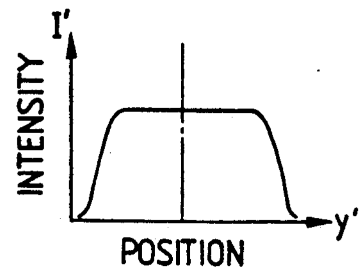
Figures 16A, 16B:
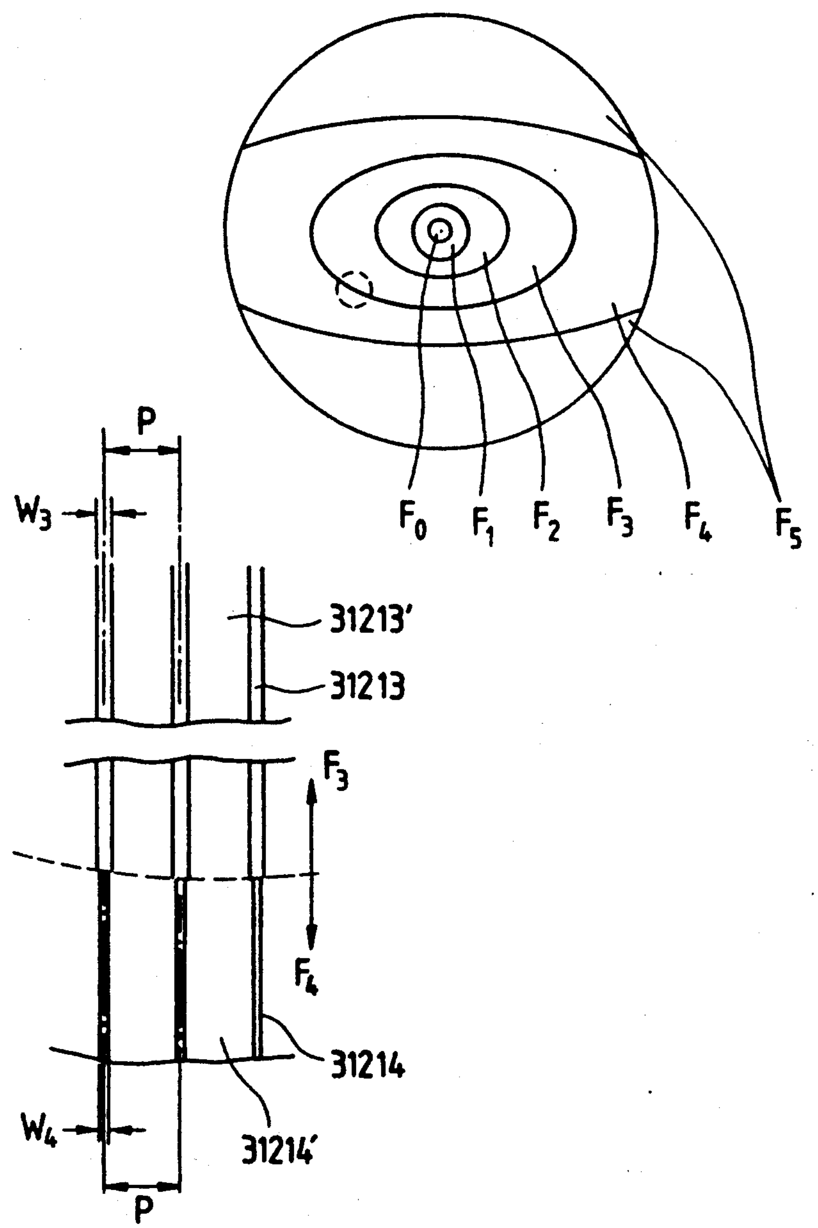
FIG. 16 is an enlarged view of a one-dimensional diffraction grating filter included in the effective amplitude distribution control unit of FIG. 13.

FIG. 13 is an illustration of assistance in explaining the effective amplitude distribution controller 312 included in the intensity uniformizing unit 31 employed in the illuminating apparatus shown in FIGS. 1 and 2. As stated above, the laser beam emitted by the laser light source has an intensity distribution as shown in (a) or (c) of FIG. 15 on a plane $\Sigma$ defined by the x-axis and y-axis in FIG. 13. The laser beam falls on a diffraction grating filter 3121. As shown in FIG. 14 and 16, the diffraction grating filter 3121 has a region corresponding to the incident laser beam and consisting of sections $F_0$, $F_1$, $F_2$, $F_3$, $F_4$, and $F_5$ consisting of diffraction gratings of line widths $W_0$, $W_1$, $W_2$, $W_3$, $W_4$ and $W_5$ respectively. Examples of the line widths are shown in Table 1, in which the line widths are expressed by the pitch R of the diffraction gratings as a unit.

TABLE 1

| Section | Line width W |
|---|---|
| $F_0$ | $W_0 = 0.25$ R |
| $F_1$ | $W_1 = 0.20$ R |
| $F_2$ | $W_2 = 0.15$ R |
| $F_3$ | $W_3 = 0.10$ R |
| $F_4$ | $W_4 = 0.05$ R |
| $F_5$ | $W_5 = 0.0$ R |

In fabricating the diffraction grating filter 3121, a chromium film is formed over the surface of a transparent, synthetic quartz glass plate by evaporation, the chromium film is coated with a photoresist for electron beam exposure, the pattern of the diffraction gratings is formed on the photoresist by an electron-beam drawing device, the pattern is developed, and then the synthetic quartz glass plate coated with the chromium film masked by the pattern of photoresist is subjected to an etching process. The transmittance of the diffraction grating filter having chromium film gratings decreases, $\pm$1st and higher-order diffracted light components increase and 0th order transmitted light component decreases accordingly with the increase of the line width W. As shown in FIG. 13, diffracted light components are filtered selectively by a filter 3122 which passes part of the transmitted light to use only the 0th order transmitted light for illumination. The laser beam passed through the effective amplitude distribution controller 312 (FIG. 3), namely, the diffraction grating filter 3121 and the filter 3122 shown in FIG. 13, has a uniform intensity distribution as shown in (b) or (d) of FIG. 15 on a plane $\Sigma'$, so that the reticle is illuminated in a uniform illuminance distribution at a substantially fixed intensity.

The diffraction grating filter 3121 of FIG. 13 is of an amplitude modulation type using a chromium film, however, the diffraction grating filter 3121 may be of a phase modulation type formed by etching a quartz glass plate masked with a pattern of a photoresist and not coated with any chromium film. The diffraction gratings of the diffraction grating filter 3121 of FIG. 3 are one-dimensional diffraction gratings, however, two-dimensional diffraction gratings may be used for the same effect. Although two-dimensional diffraction gratings are complicated in part, the same facilitate the delicate variation of the transmittance.

FIG. 17 shows another diffraction grating filter applicable to the present invention. This diffraction grating filter is a two-dimensional diffraction grating filter having a region corresponding to an incident laser beam and consisting of sections $F_0'$, $F_1'$, $F_2'$, $F_3'$, $F_4'$ and $F_5'$. The gratings (ordinarily, chromium gratings) may be circular as shown in FIG. 17 or rectangular. As shown in Table 2, the sections are different from each other in the size of grating. This two-dimensional diffraction grating functions in the manner explained with reference to FIG. 13 to (d) of FIG. 15 to illuminate the reticle in a uniform linear illuminance distribution.

TABLE 2

| Section | Diameter D |
|---|---|
| $F_0'$ | $D_0 = 0.25$ R |
| $F_1'$ | $D_1 = 0.20$ R |
| $F_2'$ | $D_2 = 0.15$ R |
| $F_3'$ | $D_3 = 0.10$ R |
| $F_4'$ | $D_4 = 0.05$ R |
| $F_5'$ | $D_5 = 0.0$ R |

Figure 18:
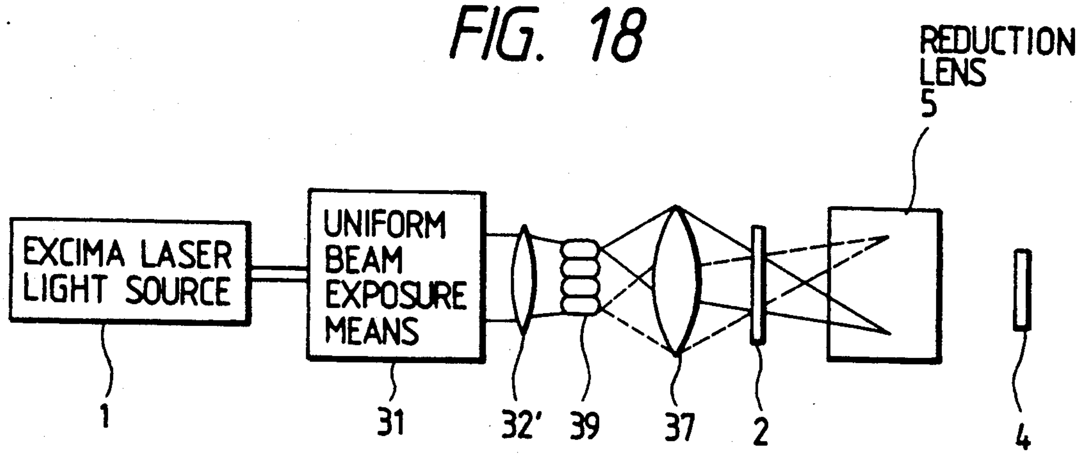
FIG. 18 is a block diagram of a uniform exposure apparatus embodying the present invention as applied to an exposure apparatus employing a fly-eye lens.

FIG. 18 shows an illuminating apparatus embodying the present invention as applied to a conventional exposure apparatus employing a fly-eye lens. The intensity distribution of a laser beam emitted by an excimer laser light source is uniformized by an intensity uniformizing unit 31, and then the laser beam is condensed by a condenser lens 32' on a fly-eye lens 39. The image of a secondary light source on the fly-eye lens 39 illuminates a reticle 2 uniformly and is focused on the pupil of a reduction lens 5 by a lens 37. Thus, the image of a pattern formed on the reticle 2 is focused on the surface of a wafer 4 coated with a photosensitive film. The illuminating apparatus illuminates the reticle 2 in a uniform illuminance distribution in even directional intensity distribution.

Figure 19:
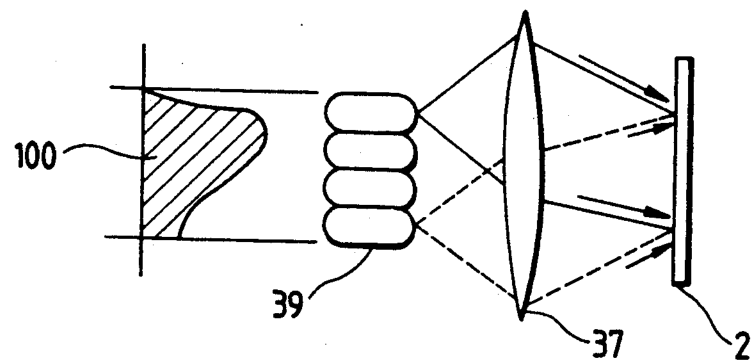
FIG. 19 is a diagram of assistance in explaining the performance of the fly-eye lens of FIG. 18 when the intensity distribution of a laser beam incident on the fly-eye lens is not uniform.

FIG. 19 shows a mode of illumination when the illuminance distribution 100 of the laser beam on the fly-eye lens 39 is not uniform. Illuminance $L_1$ by the light traveling along solid lines SL and illuminance $L_2$ by the light traveling along broken lines BL are different from each other and the directional intensity distribution is uneven In FIG. 19, $L_1 > L_2$.

Figure 20:
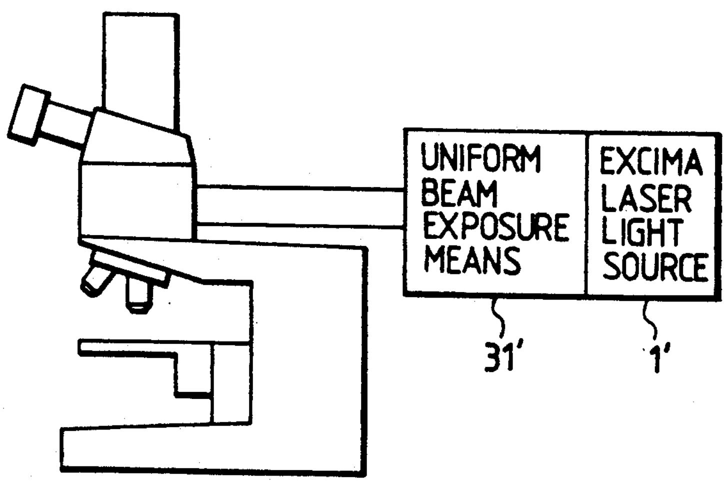
FIG. 20 is a schematic view of a microscope combined with a uniform exposure apparatus embodying the present invention.

FIG. 20 shows an application of the present invention to a microscope. An intensity uniformizing unit 31' is provided on the output side of a light source 1'. This arrangement is particularly advantageous when the light source 1' is a laser which emits a highly coherent laser beam.

FIG. 21 shows an application of the present invention to a pattern detecting apparatus. The intensity distribution of a laser beam emitted by an excimer laser light source 1' is uniformized by an intensity uniformizing unit 31'. The laser beam travels through an objective lens 71 to illuminate a pattern formed on a wafer 4. The image of the pattern is focused on a detector 72 by the objective lens 71, and the detector 72 provides a detection signal 73. The detection signal 73 is processed by a CPU (central processing unit) 74. FIG. 22 shows the pattern of a detection signal 75 provided by the detector 72 when the pattern detecting apparatus is not provided with the intensity uniformizing unit 31'. The detection signal 75 contains noise, which makes accurate pattern detection difficult.

FIG. 23 shows an application of the present invention to a laser beam machine. The intensity distribution of a laser beam emitted by an excimer laser light source 1' is uniformized by an intensity uniformizing unit 31'. A work 4' mounted on a work table 76 is scanned by the laser beam deflected by a deflecting mirror 34. The deflecting mirror 34 may be fixed and the work table 76 may be moved to position the work 4'. The laser beam is focused by a lens 71' on the work 4' for machining, such as boring. FIG. 24 shows a cross section of a hole formed in the work 4' by the laser beam machine equipped with the intensity uniformizing unit 31' of the present invention. When not equipped with the intensity uniformizing unit 31', the laser beam machine is unable to finish the circumference of a hole uniformly; the circumference of the hole is irregular as shown in FIG. 25.

As is apparent from the foregoing description, according to the present invention, an effective amplitude distribution controller is provided on an optical path to correct the intensity distribution of a laser beam in a substantially linear intensity distribution, a beam splitter is provided on the optical path before or after the effective amplitude distribution controller, and component beams split by the beam splitter are superposed on an object of illumination to illuminate the object in a uniform illuminance distribution. Furthermore, since the component beams are made to travel respectively along optical paths having different optical path lengths differing from each other by lengths not less than the coherent length of the beam, speckle noise attributable to interference between the component beams is reduced and the object can be illuminated in a uniform illuminance distribution. Superposition of the component beams respectively having intensity distributions inverse to each other on the object enables illuminating the object in a uniform illuminance distribution. Employment of a lot lens or a fly-eye lens disposed at a position corresponding to that of the object and illuminating the object by beams transmitted through the lot lens or the fly-eye lens and condensed by a condenser lens enable illumination in an even directional intensity distribution.

What is claimed is:

1. An illuminating method of illuminating a predetermined area on an object in an uniform illuminance distribution, comprising:
   - converting the intensity distribution of a light beam emitted by a highly directional light source into a substantially linear intensity distribution;
   - splitting the light beam into a plurality of component beams;
   - superposing the component beams in a predetermined area on the object so that the component teams will not interfere with each other.

2. An illuminating apparatus for illuminating a predtermined area on an object in a uniform illuminance distribution, comprising:
   - a highly directional light source;
   - effective amplitude distribution control means for converting the intensity distribution in a predetermined sectional portion of a light beam emitted by the highly directional light source into a substantially linear intensity distribution;
   - beam splitting means for splitting the light beam into a plurality of component beams; and
   - superposing means for superposing the component beams obtained by converting the intensity distribution of the light beam into a substantially linear intensity distribution by the effective amplitude distribution control means and splitting the light beam by the beam splitting means on the object.

3. An illuminating apparatus according to claim 2, wherein the differences between the respective optical path lengths of optical paths along which the component beams obtained by splitting the light beam by said beam splitting means travel respectively are not less than the coherent length of the light beam.

4. An illuminating apparatus according to claim 2, wherein said effective amplitude distribution control means comprises a transmissive or reflective medium having regions provided respectively with fine patterns differing from each other in size, and selecting means for selecting part of a light beam transmitted through or reflected from the transmissive or reflective medium.

5. An illuminating apparatus according to claim 4, wherein each of said fine patterns is an arrangement of parallel linear figures arranged at a presetting pitch.

6. An illuminating apparatus according to claim 4, wherein each of said fine patterns is a two-dimensional arrangement of figures having a predetermined shape arranged at a presetting pitch.

7. An illuminating apparatus comprising:
   - a highly directional light source;
   - beam splitting means for splitting a light beam emitted by the highly directional light source into a plurality of component beams; and
   - superposing means for making the component beams travel respectively along optical paths having optical path lengths differing from each other by lengths not less than the coherent length of the light beam and superposing the component beams on an object in intensity distributions inverse to each other.

8. An illuminating apparatus comprising:
   - a highly directional light source;

effective amplitude distribution control means for converting the intensity distribution of a desired sectional portion of a light beam emitted by the highly directional light source into a substantially linear intensity distribution;

beam splitting means for splitting the light beam into a plurality of component beams;

superposing means for superposing the component beams obtained by converting the intensity distribution of the light beam into a substantially linear intensity distribution by the effective amplitude distribution control means and splitting the light beam by the beam splitting means on a desired plane;

a lot lens or a fly-eye lens disposed with its entrance surface coinciding with the desired plane;

and a condenser lens for guiding the light transmitted through the lot lens or the fly-eye lens to the object 9. An illuminating apparatus comprising:

a highly directional light source;

beam splitting means for splitting a light beam emitted by the highly directional light source into a plurality of component beams;

superposing means for making the component beams obtained by splitting the light beam by the beam splitting means travel respectively along optical paths having optical path lengths differing from each other by lengths not less than the coherent length of the light beam and superposing the component beams on a desired plane in intensity distributions inverse to each other;

a lot lens or a fly-eye lens disposed with its entrance surface coinciding with the desired plane; and a condenser lens for guiding the light transmitted through the lot lens or the fly-eye lens to an object.

10. A projection exposure method comprising:

converting the intensity distribution of a light beam emitted by a highly directional light source into a substantially linear intensity distribution;

splitting the light beam into a plurality of component beams;

superposing the component beams in a desired area on a reticle so that the component beams will not interfere with each other to illuminate the desired area on the reticle in a uniform illuminance distribution; and projecting the image of a pattern formed on the reticle on a substrate on a reduced size by a projection lens.

11. A projection exposure method according to claim 10, wherein said light beam is an ultraviolet laser beam.

12. A projection exposure apparatus comprising:

an illuminating apparatus comprising:

a highly directional light source, effective amplitude distribution control means for converting the intensity distribution of a light beam emitted by the highly directional light source, beam splitting means for splitting the light beam into a plurality of component beams, and superposing means for superposing the component beams obtained by converting the intensity distribution of the light beam into a substantially linear intensity distribution by the effective amplitude distribution control means and splitting the light beam by the beam splitting means in a desired area on a reticle in a uniform illuminance distribution; and a projection lens for projecting the image of a circuit pattern formed on the reticle illuminated by the illuminating apparatus on a substrate on a reduced scale.

13. A projection exposure apparatus according to claim 12, wherein said highly directional light source is an excimer laser light source.

14. A projection exposure apparatus according to claim 12, wherein said projection lens is a quartz lens.

15. A projection exposure apparatus comprising:

an illuminating apparatus comprising:

a highly directional light source, beam splitting means for splitting a light beam emitted by the highly directional light source into a plurality of component beams, and superposing means for making the component beams travel respectively along optical paths having optical path lengths differing from each other by lengths not less than the coherent length of the light beam and superposing the component beams on a reticle in intensity distributions inverse to each other; and a projection lens for projecting the image of a circuit pattern formed on the reticle illuminated by the illuminating apparatus on a substrate on a reduced scale.

16. A projection exposure apparatus according to claim 15, wherein said highly directional light source is an excimer laser light source.

17. A projection exposure apparatus according to claim 15, wherein said projection lens is a quartz lens.

18. A projection exposure apparatus comprising:

an illuminating apparatus comprising:

a highly directional light source, effective amplitude distribution control means for converting the intensity distribution in a desired sectional portion of a light beam emitted by the highly directional light source into a substantially linear intensity distribution, beam splitting means for splitting the light beam into a plurality of component beams, superposing means for superposing the component beams obtained by converting the intensity distribution of the light beam into a substantially linear intensity distribution by the effective amplitude distribution control means and splitting the light beam by the beam splitting means on a set plane, a lot lens or a fly-eye lens disposed with its entrance surface coinciding with the set plane, and a condenser lens for guiding the light transmitted through the lot lens or the fly-eye lens to a reticle; and a projection lens for projecting the image of a circuit pattern formed on the reticle on a substrate on a reduced scale.

19. A projection exposure apparatus according to claim 18, wherein said highly directional light source is an excimer laser light source.

20. A projection exposure apparatus according to claim 18, wherein said projection lens is a quartz lens.

21. A projection exposure apparatus comprising:

an illuminating apparatus comprising:

a highly directional light source, beam splitting means for splitting a light beam emitted by the highly directional light source into a plurality of component beams, superposing means for making the component beams travel respectively along optical paths having optical path lengths differing from each other by lengths not less than the coherent length of the light beam and superposing the component beams on a set plane in intensity distributions inverse to each other, a lot lens or a fly-eye lens disposed with its entrance surface coinciding with the set plane, and a condenser lens for guiding the light transmitted through the lot lens or the fly-eye lens to a reticle; and a projection lens for projecting the image of a circuit pattern formed on the reticle on a substrate on a reduced scale.

22. A projection exposure apparatus according to claim 21, wherein said highly directional light source is an excimer laser light source.

23. A projection exposure apparatus according to claim 21, wherein said projection lens is a quartz lens.

* * * * *

UNITED STATES PATENT AND TRADEMARK OFFICE

CERTIFICATE OF CORRECTION

PATENT NO. : 5,016,149

DATED : May 14, 1991

INVENTOR(S) : Minoru Tanaka, et al.

It is certified that error appears in the above-identified patent and that said Letters Patent is hereby corrected as shown below:

Claim 2, column 12, lines 18-19, "predtermined" should be deleted and --predetermined-- inserted therefor.

Signed and Sealed this

Thirteenth Day of October, 1992

*Attest:*

DOUGLAS B. COMER

*Attesting Officer*

*Acting Commissioner of Patents and Trademarks*